United States Patent
Ma et al.

(10) Patent No.: US 9,245,758 B2
(45) Date of Patent: Jan. 26, 2016

(54) METHOD FOR FABRICATING SILICON-DOPED OR BORON-DOPED ALUMINUM ELECTRODE

(71) Applicant: ATOMIC ENERGY COUNCIL-INSTITUTE OF NUCLEAR ENERGY RESEARCH, Taoyuan County (TW)

(72) Inventors: Wei-Yang Ma, Taoyuan County (TW); Chien-Chang Chao, Taoyuan County (TW); Guan-Lin Chen, Taoyuan County (TW); Tsun-Neng Yang, Taoyuan County (TW)

(73) Assignee: Atomic Energy Council-Institute of Nuclear Energy Research, Taoyuan County (TW)

( * ) Notice: Subject to any disclaimer, the term of this patent is extended or adjusted under 35 U.S.C. 154(b) by 1 day.

(21) Appl. No.: 14/330,048

(22) Filed: Jul. 14, 2014

(65) Prior Publication Data
US 2015/0072468 A1 Mar. 12, 2015

(30) Foreign Application Priority Data
Sep. 11, 2013 (TW) .............................. 102132761 A

(51) Int. Cl.
*H01L 31/18* (2006.01)
*H01L 21/268* (2006.01)
*H01L 21/285* (2006.01)
*H01L 31/0224* (2006.01)
*H01L 31/068* (2012.01)

(52) U.S. Cl.
CPC .......... *H01L 21/268* (2013.01); *H01L 21/2855* (2013.01); *H01L 31/022425* (2013.01); *H01L 31/068* (2013.01)

(58) Field of Classification Search
None
See application file for complete search history.

(56) References Cited

U.S. PATENT DOCUMENTS 8,486,826 B2 * 7/2013 Anderson ................. C03C 8/02
257/E21.159
2012/0255600 A1 * 10/2012 Bedell ............... H01L 31/03926
136/255

* cited by examiner

*Primary Examiner* — Seahvosh Nikmanesh
(74) *Attorney, Agent, or Firm* — Rosenberg, Klein & Lee

(57) ABSTRACT

A method for fabricating a silicon-doped or boron-doped aluminum electrode is revealed. Aluminum target or aluminum paste prepared by selectively doped with silicon and/or boron is arranged at a silicon wafer with a passivation layer by physical deposition or screen printing. Then the doped aluminum layer is melted in linear or dot pattern to pass through the passivation layer and contact with the silicon wafer. Thus contact resistance between an aluminum back electrode and the silicon wafer of crystalline silicon solar cells is reduced and acceptor concentration on a surface layer of the silicon wafer is increased. Therefore the process speed is faster and the energy conversion efficiency of the solar cell is improved.

10 Claims, 3 Drawing Sheets

METHOD FOR FABRICATING SILICON-DOPED OR BORON-DOPED ALUMINUM ELECTRODE

BACKGROUND OF THE INVENTION

1. Fields of the Invention

The present invention relates to a method for fabricating an aluminum electrode, especially to a method for fabricating a silicon-doped or boron-doped aluminum electrode of a solar cell that is in local contact with a silicon wafer.

2. Descriptions of Related Art

Solar power is among one of the most prosperous renewable energy and solar cell related research has received considerable attention. Solar cells directly convert light energy into electricity by the photovoltaic effect without emission of greenhouse gases and pollutant gases such as carbon dioxide, nitrogen oxides, sulfur oxides, etc. Thus solar energy becomes a promising alternative source as energy resources are gradually being exhausted and the cost of energy is increasing.

However, for long-term and wider applications of solar cells, there are still many technical problems need to be overcome. The unsolved problems of solar cells include stability, lifetime, cost, etc.

Take a crystalline silicon solar cell as an example, surface passivation of the silicon wafer is crucial. Silicon atoms on surface of the silicon wafer have many dangling bonds that promote recombination of carriers. An increase in surface recombination reduces the photovoltaic conversion efficiency. Thus a layer of passivation material is deposited on surface of the crystalline silicon solar cell to form a passivation layer. Thereby surface defects are reduced to ensure minimal surface recombination losses and further improve energy conversion efficiency. Yet most of the passivation layer is made from insulating dielectric material. While producing contact electrodes, a metal layer covered over surface of the passivation layer is processed to pass through the passivation layer and have ohmic contact with silicon wafer. Thus a circuit is formed.

There are three methods commonly used now. The first method is using photolithography to form openings on the passivation layer. Then an aluminum electrode is deposited by screen printing or application of aluminum paste. This is the most mature method now but the processes are complicated and mostly used in laboratories, not suitable for mass production.

The second method is laser ablation. There are multiple openings formed by using a laser beam to irradiate the passivation layer and then deposit an aluminum electrode or screen print aluminum paste. Yet the method is easy to form holes between aluminum and silicon and this affects electrode contact performance. Moreover, in order to prevent damages to the silicon wafer, the opening formation process usually uses laser with extremely short wavelength such as excimer laser that produces energy in the ultraviolet spectrum. Within the range of such short wavelength, the laser power is low and the cost is quite high.

The third is to deposit the aluminum layer over the passivation layer by laser firing contact. Then both the aluminum layer and the passivation layer are penetrated by a laser beam at the same time to form ohmic contact between aluminum and silicon. The method has two shortcomings. (1) The electrode contact of aluminum silicon alloy is obtained by high temperature of the laser. Besides the speed problem, the laser processing also causes damages to the silicon wafer around the processed area of the silicon wafer. (2) The surface electric field is difficult to form around the aluminum electrode due to low aluminum solid solubility in silicon. Thus carrier recombination near the aluminum electrode is unable to be reduced efficiently and the conversion efficiency of the cell is further affected.

There is room for improvement and a need to provide a novel method for fabricating an aluminum electrode that achieves a good balance between the cost and the performance.

SUMMARY OF THE INVENTION

Therefore it is a primary object of the present invention to provide a method for fabricating an silicon-doped or boron-doped aluminum electrode in which an ohmic contact is formed between an aluminum layer doped with silicon, boron or both and a silicon wafer. Thus the contact resistance between an aluminum back electrode and the silicon wafer of crystalline silicon solar cells is reduced and the acceptor concentration on a surface layer of the silicon wafer is increased. The efficiency of process and energy conversion both are further improved.

It is another object of the present invention to provide a method for fabricating a silicon-doped or boron-doped aluminum electrode in which an aluminum layer is melted in dot or linear pattern to pass through a passivation layer and contact with a silicon wafer. A local contact is achieved under the dots formed so as to have surface field effect locally.

It is a further object of the present invention to provide a method for fabricating a silicon-doped or boron-doped aluminum electrode wherein the silicon-doped or boron-doped aluminum already contains aluminum-silicon alloy. Thus an ohmic contact is formed directly between the aluminum and the silicon wafer. There is no need to form aluminum-silicon alloy through adding an annealing process. Thus both power and time of laser processing can be reduced. Moreover, damages to the silicon wafer around processed area caused by laser can also be reduced.

In order to achieve the above objects, a method for fabricating a silicon-doped or boron-doped aluminum electrode which is used in solar cells includes following steps. First, a plurality of doping atoms is introduced into an aluminum material and the doping atoms are selected from a group including boron and silicon. Then the aluminum material is disposed on a silicon wafer with at least one passivation layer on a surface thereof so as to form an aluminum layer over the passivation layer. The aluminum layer includes the doping atoms. Next the aluminum layer and the passivation layer are melted in a linear or a dot pattern to form a plurality of aluminum alloy bars. The aluminum alloy bars are melted, moving downward and passing through the passivation layer to form an ohmic contact with the silicon wafer. Therefore, high-efficient crystalline silicon solar cells are produced with low cost without changing conventional processes or increasing additional process.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

In order to make the structure and characteristics as well as the effectiveness of the present invention to be further understood and recognized, the detailed description of the present invention is provided as follows along with embodiments and accompanying figures.

Figure 1:
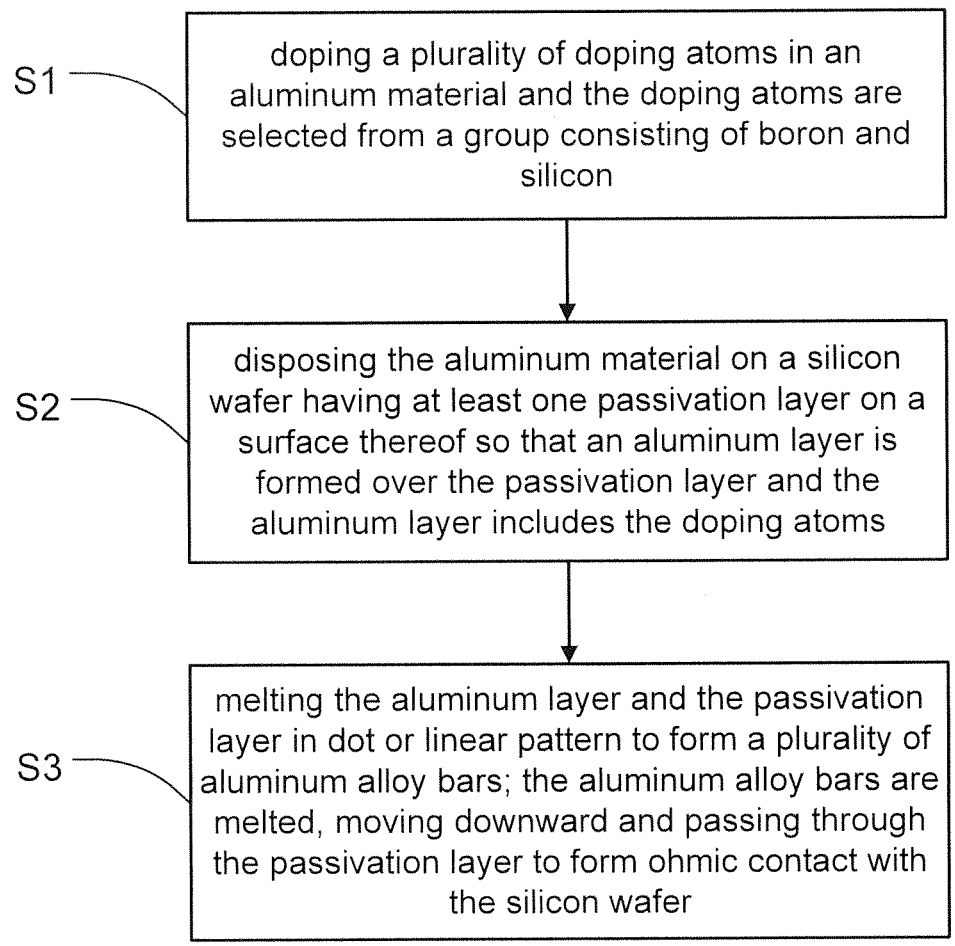
FIG. 1 is a flow chart showing steps of an embodiment according to the present invention.

Refer to FIG. 1, a method for fabricating a silicon-doped or boron-doped aluminum electrode according to the present invention includes following steps:
- Step S1: doping a plurality of doping atoms in an aluminum material and the doping atoms are selected from a group consisting of boron and silicon.
- Step S2: disposing the aluminum material on a silicon wafer having at least one passivation layer on a surface thereof so that an aluminum layer is formed over the passivation layer and the aluminum layer includes the doping atoms; and
- Step S3: melting the aluminum layer and the passivation layer in dot or linear pattern to form a plurality of aluminum alloy bars; the aluminum alloy bars are melted, moving downward and passing through the passivation layer to form ohmic contact with the silicon wafer.

Figure 2:
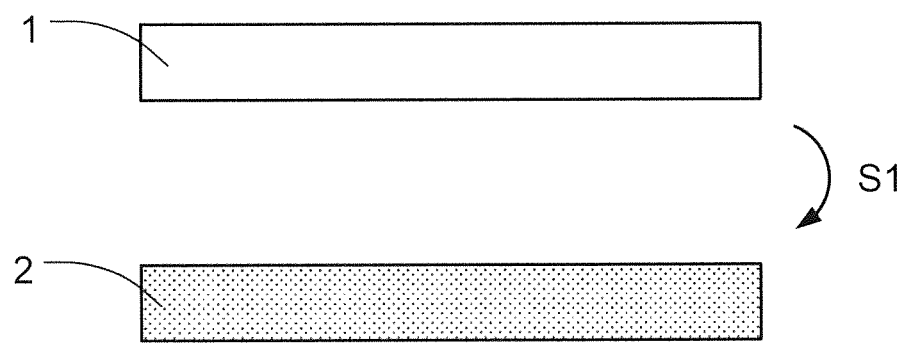
FIG. 2 is a schematic drawing showing the aluminum target is doped according to the present invention.

In the step S1, the aluminum material 1 is firstly doped, as shown in FIG. 2. Thus the aluminum material 1 originally undoped becomes silicon-doped or boron-doped aluminum material 2. Aluminum is a common material used for a back electrode of solar cells. But the back electrode of solar cells here is made from the aluminum material doped with silicon or boron instead of pure aluminum Thus aluminum material is firstly treated by the above process for following manufacturing processes.

Figure 3:
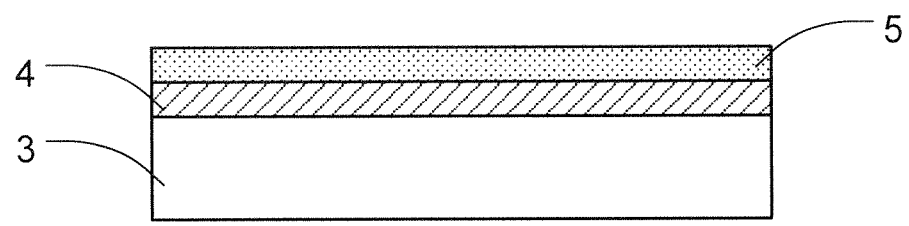
FIG. 3 is a schematic drawing showing structure of a semi-finished product deposited with aluminum layer according to the present invention.

The silicon-doped or boron-doped aluminum material 2 can be used as an aluminum target in a physical vapor deposition (PVD). The silicon-doped or boron-doped aluminum target is deposited on a silicon wafer by using an evaporator or sputter of the PVD process. The deposition time is ranging from 30 seconds to 30 minutes. Refer to FIG. 3, a semi-finished product is shown. There is already a passivation layer 4 over a silicon wafer 3 before the PVD process. Thus an aluminum layer 5 doped with atoms is formed over the passivation layer 4 after the aluminum target being evaporated or sputtered on the silicon wafer 3.

Besides PVD, the method of the present invention can also introduce silicon or boron into aluminum material in paste so as to get aluminum paste containing silicon or boron. Then the aluminum paste is arranged over the passivation layer 4 by screen printing so as to form an aluminum layer doped with atoms 5.

The silicon wafer 3 is a substrate of solar cells. It can be a single crystalline silicon (c-Si) or a polycrystalline silicon (poly-Si) substrate that is prepared by general processes including slicing of a silicon ingot into wafers, washing of wafers, etc. As mentioned above, silicon atoms on surface of the silicon wafer 3 have a plurality of unsatisfied dangling bonds. Thus minority carriers recombine at the surface of a silicon wafer and photovoltaic conversion efficiency is further reduced. In order to solve the above problem, a layer of passivation material is deposited on surface of the silicon wafer 3 for optimal surface treatment. The surface defect density is so that reduced and the surface recombination is decreased significantly by the passivation layer, and the photovoltaic conversion efficiency is increased. The materials for the passivation layer 4 deposited in the present invention include aluminum oxide ($Al_2O_3$), silicon nitride ($Si_3N_4$), silicon dioxide ($SiO_2$), etc. The commonly used p-type silicon wafer 3 made from aluminum oxide ($Al_2O_3$) provide better passivation effect. In the present invention, the silicon wafer 3 is p-type, but not limited to p-type.

After the step S2, the silicon-doped or boron-doped aluminum material 2 is coated over the passivation layer 4 by PVD or screen printing to form the aluminum layer 5 doped with silicon, boron, or both of them. The passivation materials for the passivation layer 4 are not conductive. Thus the aluminum layer 5 over the passivation layer 4 is not electrically conductive to the silicon wafer 3 and the solar cell work is unable to work. In other words, the aluminum layer 5 is not in contact with the silicon wafer 3 at this stage.

Figure 4:
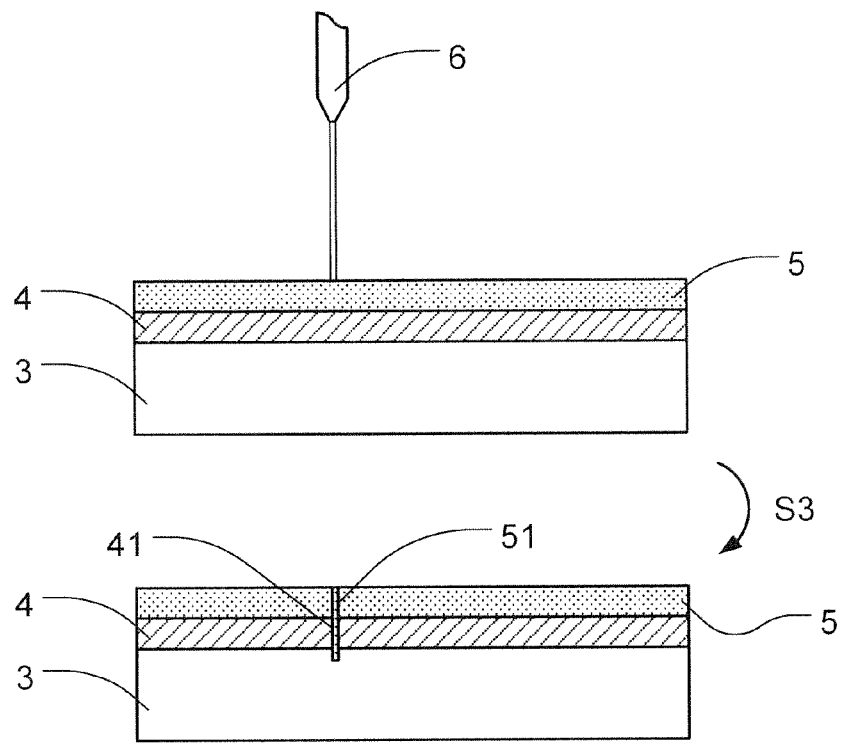
FIG. 4 is a schematic drawing showing melting of a doped aluminum layer in dot or linear pattern to form aluminum alloy bars that pass through a passivation layer according to the present invention.

Refer to FIG. 4, in the step S3 of the present invention, the aluminum layer 5 containing doping atoms is heated at high temperature and is melted in dot or linear pattern to form a plurality of aluminum alloy bars 51. The aluminum alloy bars 51 moves downward to form ohmic contact with the silicon wafer 3. The melting process in dot or linear pattern is preferred to be performed by a laser module 6. The laser module 6 features on high and concentrated energy, stable power and easy operation in dot or linear pattern. The difference between the dot and the linear pattern is in that whether the laser module 6 is further moved linearly. While the laser module 6 emits a laser beam toward the aluminum layer 5 for performing dot-pattern laser melting process, the laser module 6 provides two functions at the same time. First, openings 41 are formed on the passivation layer 4 due to high energy the laser provides. And second, the aluminum material doped with silicon or boron is melted into the openings 41 of the passivation layer 4 and extended downward. Thus an aluminum-silicon ohmic contact is formed between the doped aluminum and the silicon wafer 3. At the same time, a surface field effect is generated locally.

As a result of the silicon and/or boron-doped aluminum layer 5 in contact with the silicon wafer 3 contains aluminum-silicon alloy already and the aluminum layer 5 forms ohmic contact with the silicon wafer 3 directly, there is no need to anneal aluminum and the silicon wafer 3 to perform aluminum-silicon alloy. Thus both power and time of the laser processing can be reduced. Moreover, damages to the silicon wafer 3 around processed area caused by the laser can also be reduced. Furthermore, the aluminum melted and extended into the silicon wafer 3 increases acceptor (such as aluminum, boron etc.) concentration in the silicon wafer 3 while the aluminum being doped with boron. This is due to that boron solid solubility in silicon is much higher than aluminum solid solubility in silicon. A high doping concentration is formed locally in the processed area and this is beneficial to the formation of ohmic contact. The surface field effect is also formed locally.

Figure 5:
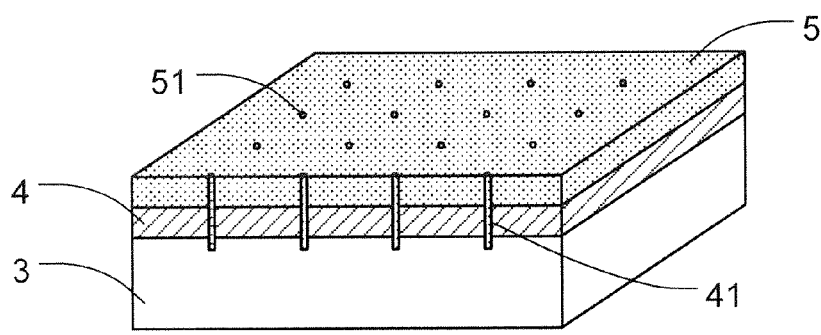
FIG. 5 is a schematic drawing showing melting of a doped aluminum layer in a dot pattern uniformly according to the present invention.

Take an operation procedure in which the aluminum layer 5 containing doping atoms is heated and melted in dot pattern to form a plurality of aluminum alloy bars 51 as an example. The density of the dot pattern is ranging from 4 to 411 dots per square centimeter ($cm^2$) and the dots are distributed evenly, as shown in FIG. 5. The specification of the silicon wafer 3 commonly used in the field is 156 square millimeter (mm$^2$) and so that there are 1000~10000 aluminum alloy bars 51 distributed over the silicon wafer 3 through the present invention.

After preparation of the silicon-doped or boron-doped aluminum electrode being completed, disposition of other layers of films is performed. The structure, arrangement or preparation of other layers of the solar cell is not limited in the present invention. The present invention only focuses on preparation of the back electrode and performance improvement of the solar cell.

By the steps mentioned above, the aluminum material is selectively doped with silicon and/or boron so as to reduce contact resistance between the aluminum back electrode and the silicon wafer of the crystalline silicon solar cell as well as increase acceptor concentration on the surface layer of the silicon wafer. Thus the process speed is faster and the energy conversion efficiency of the solar cell is improved. There is no need to change conventional processes and no additional process required. While producing high-efficiency crystalline silicon solar cells, the cost per watt is significantly reduced. The method of the present invention brings economic benefits and easy to be industrialized directly. With various perspectives including improved performance, low cost, etc., the method of the present invention has commercial value and practical applications.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A method for fabricating a silicon-doped or boron-doped aluminum electrode of solar cells comprising the steps of:

doping a plurality of doping atoms in an aluminum material and the doping atoms are selected from a group consisting of boron and silicon;

disposing the aluminum material on a silicon wafer having at least one passivation layer on a surface thereof so as to form an aluminum layer over the passivation layer and the aluminum layer having the doping atoms; and melting the aluminum layer and the passivation layer in dot or linear pattern to form a plurality of aluminum alloy bars, wherein the aluminum alloy bars are melted, moving downward and passing through the passivation layer to form ohmic contact with the silicon wafer.

2. The method as claimed in claim 1, wherein in the step of disposing the aluminum material on the silicon wafer, the aluminum material is aluminum target and is disposed on the passivation layer by physical vapor deposition.

3. The method as claimed in claim 2, wherein the physical vapor deposition is evaporation or sputtering.

4. The method as claimed in claim 2, wherein deposition time of the physical vapor deposition is ranging from 30 seconds to 30 minutes.

5. The method as claimed in claim 1, wherein in the step of disposing the aluminum material on the silicon wafer, the aluminum material is aluminum paste and is disposed on the passivation layer by screen printing.

6. The method as claimed in claim 1, wherein the passivation layer is insulating.

7. The method as claimed in claim 1, wherein the passivation layer is made from material selected from the group consisting of aluminum oxide ($Al_2O_3$), silicon nitride ($Si_3N_4$), and silicon dioxide ($SiO_2$).

8. The method as claimed in claim 1, wherein in the step of melting the aluminum layer and the passivation layer in dot or linear pattern, a laser beam is used to melt the aluminum layer.

9. The method as claimed in claim 1, wherein in the step of melting the aluminum layer and the passivation layer in dot or linear pattern, density of the dot pattern is 4 to 411 dots per square centimeter.

10. The method as claimed in claim 1, wherein the silicon wafer is p-type.

\* \* \* \* \*